United States Patent
Lingle et al.

(10) Patent No.: US 7,344,782 B2
(45) Date of Patent: Mar. 18, 2008

(54) COATED ARTICLE WITH LOW-E COATING INCLUDING IR REFLECTING LAYER(S) AND CORRESPONDING METHOD

(75) Inventors: Philip J. Lingle, Temperance, MI (US); Anton Dietrich, Fontnas (CH); Jens-Peter Muller, Differdange (LU)

(73) Assignees: Guardian Industries Corp., Auburn Hills, MI (US); Centre Luxembourgeois de Recherches pour le Verre et la Ceramique S.A. (C.R.V.C.), Grand Duche de (LU)

( * ) Notice: Subject to any disclaimer, the term of this patent is extended or adjusted under 35 U.S.C. 154(b) by 21 days.

(21) Appl. No.: 10/800,012

(22) Filed: Mar. 15, 2004

(65) Prior Publication Data
US 2004/0229074 A1 Nov. 18, 2004

Related U.S. Application Data

(60) Continuation-in-part of application No. 10/787,823, filed on Feb. 27, 2004, and a continuation-in-part of application No. 10/453,790, filed on Jun. 4, 2003, and a division of application No. 10/337,383, filed on Jan. 7, 2003, now Pat. No. 6,723,211, and a division of application No. 10/337,384, filed on Jan. 7, 2003, now Pat. No. 6,686,050, which is a division of application No. 09/794,224, filed on Feb. 28, 2001, now Pat. No. 6,576,349, said application No. 09/794,224.

(60) Provisional application No. 60/217,101, filed on Jul. 10, 2000.

(51) Int. Cl.
*B32B 17/06* (2006.01)

(52) U.S. Cl. ............ 428/428; 428/432; 428/448; 428/697; 428/698; 428/699; 428/701; 428/702; 428/704

(58) Field of Classification Search ............... 428/428, 428/432, 448, 697, 698, 699, 701, 702, 704
See application file for complete search history.

(56) References Cited

U.S. PATENT DOCUMENTS

| 4,806,220 A | 2/1989 | Finley |
| 4,898,789 A | 2/1990 | Finley |
| 5,110,662 A | 5/1992 | Depauw et al. |

(Continued)

FOREIGN PATENT DOCUMENTS

EP  0 567 735  11/1993

(Continued)

OTHER PUBLICATIONS

U.S. Appl. No. 10/797,580, filed Mar. 11, 2004.

(Continued)

*Primary Examiner*—Gwendolyn Blackwell
(74) *Attorney, Agent, or Firm*—Nixon & Vanderhye P.C.

(57) ABSTRACT

A coated article is provided that may be heat treated in certain example embodiments. A coating of the coated article includes zinc oxide inclusive layer(s) located under infrared (IR) reflecting layer(s) of a material such as silver. In certain example embodiments, coated articles are designed so as to realize higher visible transmission and/or lower sheet resistance values.

25 Claims, 1 Drawing Sheet

U.S. PATENT DOCUMENTS

| | | |
|---|---|---|
| 5,270,517 A | 12/1993 | Finley |
| 5,344,718 A | 9/1994 | Hartig et al. |
| 5,552,180 A | 9/1996 | Finley et al. |
| 5,557,462 A | 9/1996 | Hartig et al. |
| 5,584,902 A | 12/1996 | Hartig et al. |
| 5,688,585 A | 11/1997 | Lingle et al. |
| 5,718,980 A | 2/1998 | Koch et al. |
| 5,770,321 A | 6/1998 | Hartig et al. |
| 5,800,933 A | 9/1998 | Hartig et al. |
| 5,821,001 A | 10/1998 | Arbab et al. |
| 5,948,538 A | 9/1999 | Brochot et al. |
| 6,042,934 A | 3/2000 | Guiselin et al. |
| 6,090,481 A | 7/2000 | Depauw et al. |
| 6,287,675 B1 | 9/2001 | Guiselin et al. |
| 6,322,881 B1 | 11/2001 | Boire et al. |
| 6,336,999 B1 | 1/2002 | Lemmer et al. |
| 6,340,529 B1 | 1/2002 | Ebisawa et al. |
| 6,445,503 B1 | 9/2002 | Lingle |
| 6,472,072 B1 * | 10/2002 | Ebisawa et al. ............ 428/432 |
| 6,514,620 B1 | 2/2003 | Lingle et al. |
| 6,524,688 B1 | 2/2003 | Eby et al. |
| 6,524,714 B1 | 2/2003 | Neuman et al. |
| 6,541,084 B2 | 4/2003 | Wang |
| 6,572,940 B1 | 6/2003 | Noethe et al. |
| 6,576,349 B2 | 6/2003 | Lingle et al. |
| 6,582,809 B2 | 6/2003 | Boire et al. |
| 6,589,658 B1 | 7/2003 | Stachowiak |
| 6,602,608 B2 | 8/2003 | Stachowiak |
| 6,605,358 B1 | 8/2003 | Stachowiak |
| 6,625,875 B2 | 9/2003 | Sol |
| 6,632,491 B1 | 10/2003 | Thomsen et al. |
| 6,686,050 B2 | 2/2004 | Lingle et al. |
| 2002/0064662 A1 | 5/2002 | Lingle et al. |
| 2002/0102352 A1 * | 8/2002 | Hartig et al. ............... 428/698 |
| 2003/0049464 A1 | 3/2003 | Glenn et al. |
| 2003/0150711 A1 | 8/2003 | Laird |
| 2003/0194570 A1 | 10/2003 | Lingle et al. |
| 2004/0005467 A1 | 1/2004 | Neuman et al. |
| 2004/0043226 A1 | 3/2004 | Laird et al. |

FOREIGN PATENT DOCUMENTS

| | | |
|---|---|---|
| EP | 1 174 397 | 1/2002 |
| EP | 1 238 950 | 9/2002 |
| EP | 1 329 307 | 7/2003 |

OTHER PUBLICATIONS

U.S. Appl. No. 10/797,561, filed Mar. 11, 2004.
U.S. Appl. No. 10/787,823, filed Feb. 27, 2004.
U.S. Appl. No. 10/453,790, filed Jun. 4, 2003.
U.S. Appl. No. 10/337,383, filed Jan. 7, 2003.
U.S. Appl. No. 60/217,101, filed Jul. 10, 2000.

* cited by examiner

COATED ARTICLE WITH LOW-E COATING INCLUDING IR REFLECTING LAYER(S) AND CORRESPONDING METHOD

This application is a continuation-in-part (CIP) of U.S. Ser. No. 10/787,823, filed Feb. 27, 2004; and is also a CIP of U.S. Ser. No. 10/453,790, filed Jun. 4, 2003, which is a divisional of each of (a) Ser. No. 09/794,224, filed Feb. 28, 2001 (U.S. Pat. No. 6,576,349); (b) Ser. No. 10/337,383, filed Jan. 7, 2003; now U.S. Pat. No. 6,723,211 and (c) Ser. No. 10/337,384, filed Jan. 7, 2003 (U.S. Pat. No. 6,686,050), which claim priority on U.S. Provisional Patent Application No. 60/217,101, filed Jul. 10, 2000, the disclosures of which are all hereby incorporated herein by reference.

This invention relates to a coated article including a low-E coating. In certain example embodiments, the coated article may be heat treated (e.g., thermally tempered, heat bent and/or heat strengthened). Coated articles according to certain example embodiments of this invention may be used in the context of vehicle windshields, insulating glass (IG) window units, other types of windows, or in any other suitable application.

BACKGROUND OF THE INVENTION

Coated articles are known in the art for use in window application such as insulating glass (IG) window units, vehicle windows, and/or the like. It is known that in certain instances, it is desirable to heat treat (e.g., thermally temper, heat bend and/or heat strengthen) such coated articles for purposes of tempering, bending, or the like in certain example instances.

In certain situations, designers of coated articles often strive for a combination of high visible transmission, substantially neutral color, low emissivity (or emittance), and low sheet resistance ($R_s$). High visible transmission for example may permit coated articles to be more desirable in applications such as vehicle windshields or the like, whereas low-emissivity (low-E) and low sheet resistance characteristics permit such coated articles to block significant amounts of IR radiation so as to reduce for example undesirable heating of vehicle or building interiors.

However, heat treatment of coated articles typically requires use of temperature(s) of at least 580 degrees C., more preferably of at least about 600 degrees C. and still more preferably of at least 620 degrees C. The use of such high temperatures (e.g., for 5-10 minutes or more) often causes coatings to break down and/or causes one or more of the aforesaid desirable characteristics to significantly deteriorate in an undesirable manner. Those in the art strive for heat treatability in certain applications, coupled with acceptable optical and solar characteristics.

U.S. Pat. No. 6,686,050 (see also US 2002/0064662 A1) discloses, inter alia, a heat treatable coated article. Consider the below-listed layer stack where the layers are listed in order from a 2.1 mm glass substrate outwardly. The thicknesses are provided for purposes of example only.

| Glass Substrate | Thickness (Å) |
|---|---|
| $TiO_2$ | 140 |
| $Si_3N_4$ | 160 |
| $NiCrO_x$ | 32 |
| Ag | 96 |
| $NiCrO_x$ | 26 |
| $SnO_2$ | 730 |
| $Si_3N_4$ | 160 |
| $NiCrO_x$ | 21 |
| Ag | 101 |
| $NiCrO_x$ | 26 |
| $SnO_2$ | 128 |
| $Si_3N_4$ | 370 |

As evidenced by Examples 1-3 of U.S. Pat. No. 6,686,050, following heat treatment coated articles with these layers had sheet resistance ($R_s$) of about 3.3 to 3.5 ohms/square, and following lamination had a visible transmission of about 75%. There is certainly room for improvement as to one or both of these respects. For example, it would be desirable if: (a) visible transmission could be increased following lamination so as to improve optical characteristics, and/or (b) sheet resistance lowered before and/or after heat treatment (HT) so as to improve solar characteristics.

In view of the above, it will be apparent to those skilled in the art that there exists a need for coated articles which are capable of providing high visible transmission, substantially neutral color, low emissivity (or emittance), and/or low sheet resistance ($R_s$). In certain example embodiments, it may be desired that one or all of these characteristics can be achieved even after the coated article has been heat treated and/or laminated.

BRIEF SUMMARY OF EXAMPLE EMBODIMENTS OF THE INVENTION

In certain example embodiments of this invention, the aforesaid layer stack discussed in the background section may be modified in order to achieve improved optical and/or solar characteristics. For example, and without limitation, certain example embodiments of this invention are able to achieve higher visible transmission and/or lower sheet resistance before and/or after heat treatment compared to the coated article discussed above in the background section.

In certain example embodiments of this invention, coated articles have been provided which are capable of realizing high visible transmission and/or low sheet resistance characteristics.

In certain example embodiments of this invention, there is provided a heat treated coated article comprising a coating supported by a glass substrate, the coating comprising: a first layer comprising silicon nitride which is located on and directly contacts a surface of the glass substrate; a first layer comprising zinc oxide located over at least the first layer comprising silicon nitride; a first infrared (IR) reflecting layer comprising silver located over and contacting the first layer comprising zinc oxide; a second layer comprising silicon nitride located over at least the first IR reflecting layer; a second layer comprising zinc oxide located over at least the second layer comprising silicon nitride; a second IR reflecting layer comprising silver located over and contacting the second layer comprising zinc oxide; a layer comprising an oxide of Ni and/or Cr located over and contacting the second IR reflecting layer; at least another dielectric layer located over at least the layer comprising an oxide of Ni and/or Cr; and wherein the coated article following heat treatment, measured monolithically, has a sheet resistance of less than or equal to 3.0 ohms/square and a visible transmission of at least 78%.

In certain other example embodiments of this invention, there is provided a heat treated coated article comprising a coating supported by a glass substrate, the coating comprising: a first dielectric layer on the substrate; a first infrared (IR) reflecting layer located over at least the first dielectric layer; a second dielectric layer located over at least the first IR reflecting layer; a second IR reflecting layer located over at least the second dielectric layer; a third dielectric layer located over at least the second IR reflecting layer; and wherein the coated article following heat treatment, measured monolithically, has a sheet resistance of less than or equal to 2.5 ohms/square and a visible transmission of at least 78%.

In still further example embodiments of this invention, there is provided a laminated vehicle windshield including first and second glass substrates laminated to one another, at least the first glass substrate supporting a multi-layered coating, the coating comprising: a first dielectric layer on the first glass substrate; a first infrared (IR) reflecting layer located over at least the first dielectric layer; a second dielectric layer located over at least the first IR reflecting layer; a second IR reflecting layer located over at least the second dielectric layer; a third dielectric layer located over at least the second IR reflecting layer; and wherein the laminated vehicle windshield, following heat treatment of each of the first and second glass substrates, has a sheet resistance via the coating of less than or equal to 2.5 ohms/square, and has a visible transmission of at least 77%.

DETAILED DESCRIPTION OF EXAMPLES OF THE INVENTION

Figure 1:
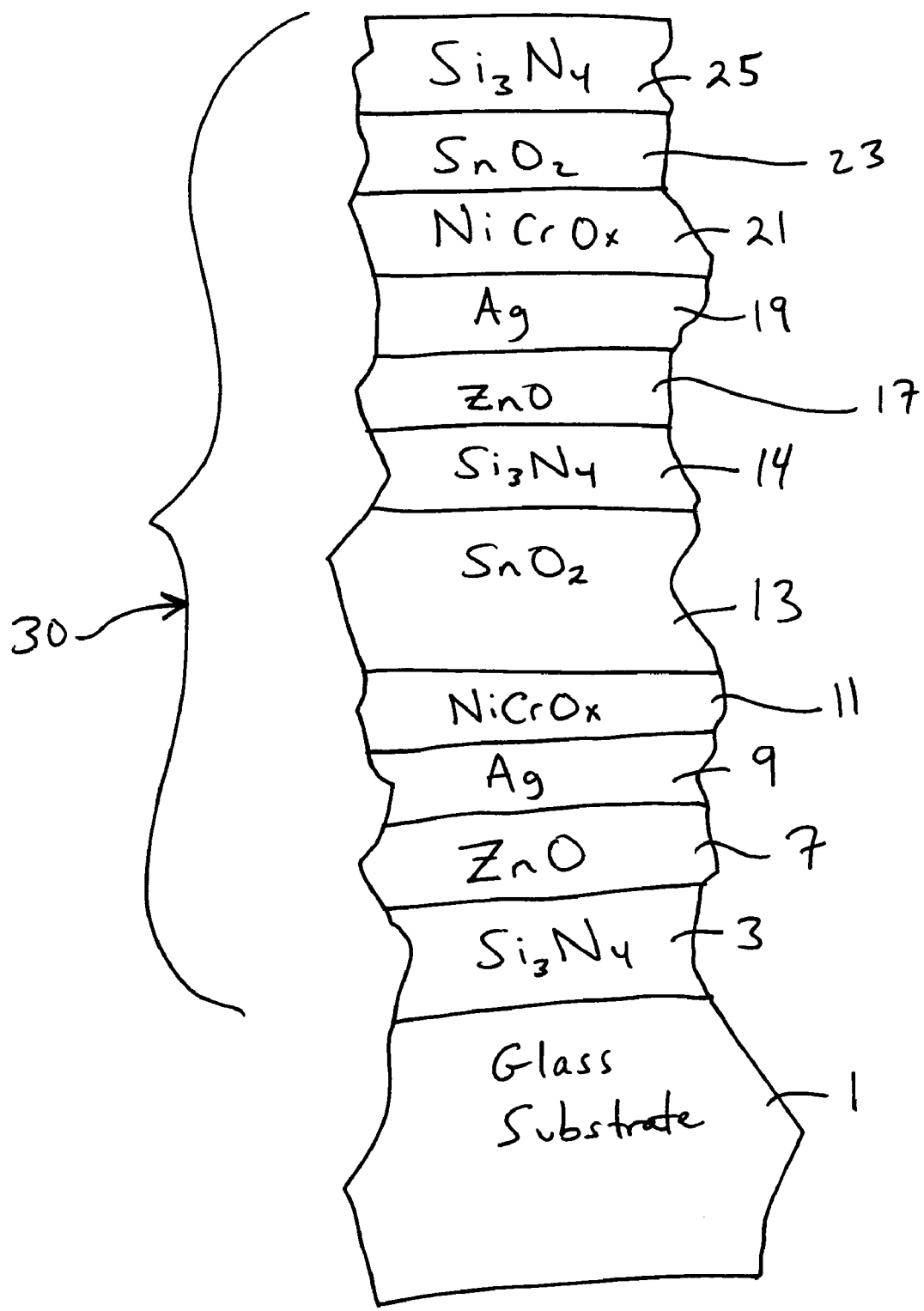
FIG. 1 is a cross sectional view of a coated article according to an example embodiment of this invention.

Coated articles herein may be used in applications such as vehicle windshields, monolithic windows, IG window units, and/or any other suitable application that includes single or multiple glass substrates. In vehicle windshield applications, for example, a pair of glass substrates may be laminated together with a polymer based layer of a material such as PVB, and the coating is provided on the interior surface of one of the glass substrates adjacent the polymer based layer. In certain example embodiments of this invention, the coating includes a double-silver stack, although this invention is not so limited in all instances.

Surprisingly, it has been found that by performing one or more of the following modifications to the coating discussed above in the background section, improved optical and/or solar characteristics, and/or improved thermal stability, can be achieved: (a) replacing the $NiCrO_x$ layers immediately under the Ag layers with layers comprising zinc oxide; (b) removal of the $TiO_2$ bottom layer; (c) making the bottom two silicon nitride layers more Si-rich; (d) thinning certain anti-reflective layers; and/or (e) optimizing the thicknesses and stoichiometries of the $NiCrO_x$ layers immediately over the Ag layers. In particular, by performing one or more of these modifications, it has unexpectedly been found that the resulting coated article when heat treated unexpectedly has, for example: higher visible transmission, improved thermal stability, lower sheet resistance ($R_s$), and lower emissivity (e.g., hemispherical emissivity). These surprising results are highly advantageous and represent a significant improvement in the art, since lower emissivity, lower sheet resistance, higher visible transmission, and/or thermal stability are typically desired features in coated articles.

For example, in certain example embodiments of this invention, heat treated coated articles having multiple IR reflecting layers (e.g., two spaced apart silver based layers) are capable of realizing a sheet resistance ($R_s$) of less than or equal to 3.0 (more preferably less than or equal to 2.5, even more preferably less than or equal to 2.1). In certain example embodiments, following heat treatment and as measured in monolithic form, coated articles herein are capable of realizing a visible transmission (Ill. C, 2 degree) of at least 78%, more preferably of at least 79%, and most preferably of at least 80%. Moreover, in certain example embodiments, following heat treatment and lamination, coated articles herein are capable of realizing a visible transmission (Ill. D65, 10 degree) of at least 75%, more preferably of at least 76%, even more preferably of at least 77%, and in certain embodiments of at least 77.5%.

The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes.

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and coating (or layer system) 30 provided on the substrate 1 either directly or indirectly. The coating (or layer system) 30 includes: dielectric silicon nitride layer 3 which may be $Si_3N_4$, of the Si-rich type for haze reduction, or of any other suitable stoichiometry in different embodiments of this invention, first lower contact layer 7 (which contacts IR reflecting layer 9), first conductive and preferably metallic infrared (IR) reflecting layer 9, first upper contact layer 11 (which contacts layer 9), dielectric layer 13 (which may be deposited in one or multiple steps in different embodiments of this invention), another silicon nitride layer 14, second lower contact layer 17 (which contacts IR reflecting layer 19), second conductive and preferably metallic IR reflecting layer 19, second upper contact layer 21 (which contacts layer 19), dielectric layer 23, and finally protective dielectric layer 25. The "contact" layers 7, 11, 17 and 21 each contact at least one IR reflecting layer (e.g., layer based on Ag). The aforesaid layers 3-25 make up low-E (i.e., low emissivity) coating 30 which is provided on glass or plastic substrate 1.

In monolithic instances, the coated article includes only one glass substrate 1 as illustrated in FIG. 1. However, monolithic coated articles herein may be used in devices such as laminated vehicle windshields, IG window units, and the like. A laminated vehicle window such as a windshield includes first and second glass substrates laminated to one another via a polymer based interlayer (e.g., see U.S. Pat. No. 6,686,050, the disclosure of which is incorporated herein by reference). One of these substrates of the laminate may support coating 30 on an interior surface thereof in certain example embodiments. As for IG window units, an IG window unit may include two spaced apart substrates 1. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 1 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating 30 may be provided on the interior surface of either substrate facing the gap.

Dielectric layers 3 and 14 may be of or include silicon nitride in certain embodiments of this invention. Silicon nitride layers 3 and 14 may, among other things, improve heat-treatability of the coated articles, e.g., such as thermal tempering or the like. The silicon nitride of layers 3 and/or 14 may be of the stoichiometric type ($Si_3N_4$) type, or alternatively of the Si-rich type in different embodiments of this invention. For example, Si-rich silicon nitride 3 (and/or 14) combined with zinc oxide inclusive layer 7 (and/or 17) under a silver based IR reflecting layer 9 (and/or 19) may permit the silver to be deposited (e.g., via sputtering or the like) in a manner which causes its sheet resistance to be lessened compared to if certain other material(s) were under the silver. Moreover, the presence of free Si in a Si-rich silicon nitride inclusive layer 3 may allow certain atoms such as sodium (Na) which migrate outwardly from the glass 1 during HT to be more efficiently stopped by the Si-rich silicon nitride inclusive layer before they can reach the silver and damage the same. Thus, it is believed that the oxidation caused by heat treatment allows visible transmission to increase, and that the Si-rich $Si_xN_y$ in layer 3 can reduce the amount of damage done to the silver layer(s) during HT in certain example embodiments of this invention thereby allowing sheet resistance ($R_s$) to decrease in a satisfactory manner.

In certain example embodiments, when Si-rich silicon nitride us used in layer(s) 3 and/or 14, the Si-rich silicon nitride layer as deposited may be characterized by $Si_xN_y$ layer(s), where x/y may be from 0.76 to 1.5, more preferably from 0.8 to 1.4, still more preferably from 0.85 to 1.2. Moreover, in certain example embodiments, before and/or after HT the Si-rich $Si_xN_y$ layer(s) may have an index of refraction "n" of at least 2.05, more preferably of at least 2.07, and sometimes at least 2.10 (e.g., 632 nm) (note: stoichiometric $Si_3N_4$ which may also be used has an index "n" of 2.02-2.04). In certain example embodiments, it has surprisingly been found that improved thermal stability is especially realizable when the Si-rich $Si_xN_y$ layer(s) as deposited has an index of refraction "n" of at least 2.10, more preferably of at least 2.2, and most preferably from 2.2 to 2.4. Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0). Again, in certain example embodiments, it has surprisingly been found that improved thermal stability can be realized when "k" for the Si-rich $Si_xN_y$ layer is from 0.001 to 0.05 as deposited (550 nm). It is noted that n and k tend to drop due to heat treatment.

Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers may, however, be slightly oxidized in certain embodiments of this invention.

The upper contact layers 11 and 21 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ in these layers (11 and/or 21) allows durability to be improved. The $NiCrO_x$ of layers 11 and/or 21 may be fully oxidized in certain embodiments of this invention (i.e., fully stoichiometric), or alternatively may only be partially oxidized. In certain instances, the $NiCrO_x$ layers 11 and/or 21 may be at least about 50% oxidized. Contact layers 11 and/or 21 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layers 11 and/or 21 (e.g., of or including an oxide of Ni and/or Cr) may or may not be continuous in different embodiments of this invention across the entire IR reflecting layer.

Dielectric layer 13 may be of or include tin oxide in certain example embodiments of this invention. However, as with other layers herein, other materials may be used in different instances.

Lower contact layers 7 and/or 17 in certain embodiments of this invention are of or include zinc oxide (e.g., ZnO). The zinc oxide of layer(s) 7, 17 may contain other materials as well such as Al (e.g., to form $ZnAlO_x$). For example, in certain example embodiments of this invention, one or more of zinc oxide layers 7, 17 may be doped with from about 1 to 10% Al, more preferably from about 1 to 5% Al, and most preferably about 2 to 4% Al. The use of zinc oxide 7, 17 under the silver 9, 19 allows for an excellent quality of silver to be achieved.

Dielectric layer 23 may be of or include tin oxide in certain example embodiments of this invention. However, layer 23 is optional and need not be provided in certain example embodiments of this invention. Dielectric layer 25, which may be an overcoat including one or more layers in certain example instances, may be of or include silicon nitride (e.g., $Si_3N_4$) or any other suitable material in certain example embodiments of this invention. Optionally, other layers may be provided above layer 25. Layer 25 is provided for durability purposes, and to protect the underlying layers during heat treatment and/or environmental use. In certain example embodiments, layer 25 may have an index of refraction (n) of from about 1.9 to 2.2, more preferably from about 1.95 to 2.05.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 1 embodiment are as follows, from the glass substrate outwardly:

| Example Materials/Thicknesses; FIG. 1 Embodiment | | | |
|---|---|---|---|
| Layer | Preferred Range (Å) | More Preferred (Å) | Example (Å) |
| Glass (1-10 mm thick) | | | |
| $Si_xN_y$ (layer 3) | 40-450 Å | 190-250 Å | 210 Å |
| $ZnO_x$ (layer 7) | 10-300 Å | 40-150 Å | 100 Å |
| Ag (layer 9) | 50-250 Å | 80-120 Å | 98 Å |
| $NiCrO_x$ (layer 11) | 10-100 Å | 30-45 Å | 35 Å |
| $SnO_2$ (layer 13) | 0-1,000 Å | 350-630 Å | 570 Å |
| $Si_xN_y$ (layer 14) | 50-450 Å | 90-150 Å | 120 Å |
| $ZnO_x$ (layer 17) | 10-300 Å | 40-150 Å | 95 Å |
| Ag (layer 19) | 50-250 Å | 80-220 Å | 96 Å |
| $NiCrO_x$ (layer 21) | 10-100 Å | 30-45 Å | 35 Å |
| $SnO_2$ (layer 23) | 0-750 Å | 150-300 Å | 200 Å |
| $Si_3N_4$ (layer 25) | 0-750 Å | 100-320 Å | 180 Å |

Surprisingly, it has been found that by modifying the coating discussed above in the background section in one or more of the following manners, improved optical and/or solar characteristics can be achieved: (a) replacing the $NiCrO_x$ layers immediately under the Ag layers with layers comprising zinc oxide; (b) removal of the $TiO_2$ bottom layer; (c) making the bottom two silicon nitride layers significantly Si-rich as deposited; (d) thinning certain anti-reflective layers; and/or (e) optimizing the thicknesses and stoichiometries of the $NiCrO_x$ layers immediately over the Ag layers. In particular, by performing one or more of these modifications, it has unexpectedly been found that the resulting coated article when heat treated unexpectedly has, for example: higher visible transmission, improved thermal stability, lower sheet resistance ($R_s$), and lower emissivity (e.g., hemispherical emissivity). These surprising results are highly advantageous and represent a significant improvement in the art, since lower emissivity, lower sheet resistance, higher visible transmission, and/or thermal stability are typically desired features in coated articles. In certain example embodiments, at least two of modifications (a)-(e) are used in combination, more preferably at least three of modifications (a)-(e), even more preferably at least four of modifications (a)-(e) are used in combination, and most preferably all of modifications (a)-(e) are used in combination so as to achieve the unexpected results discussed herein.

For example, it can be seen that in the FIG. 1 example embodiment of this invention, silicon nitride is located directly on and contacting the glass substrate 1. Additionally, the $NiCrO_x$ layers immediately over the Ag layers have been significantly thickened (e.g., to from 30-45 Å thick) compared to the coated article discussed in the background section. Moreover, the silver layers in certain example embodiments of this invention are located over and contacting layers comprising zinc oxide (as opposed to $NiCrO_x$). It also can be seen that certain anti-reflective layers such as layers 13, 14 and 25 have been thinned compared to the article discussed above in the background section. As a result of these modification, it has surprisingly been found that higher visible transmission and lower sheet resistance/emissivity values are achievable following heat treatment and/or lamination.

In certain example embodiments of this invention, coated articles herein may have the following optical and solar characteristics set forth in Table 2 when measured monolithically (before any optional HT). The sheet resistances ($R_s$) herein take into account all IR reflecting layers (e.g., silver layers 9, 19).

| Optical/Solar Characteristics (Monolithic; pre-HT) | | | |
|---|---|---|---|
| Characteristic | General | More Preferred | Most Preferred |
| $R_s$ (ohms/sq.): | <=3.5 | <=3.0 | <=2.8 |
| $E_n$: | <=0.07 | <=0.04 | <=0.03 |
| $T_{vis}$ (Ill. C. 2°): | >=70% | >=75% | >=75.5% |

In certain example embodiments, coated articles herein may have the following characteristics, measured monolithically for example, after heat treatment (HT):

| Optical/Solar Characteristics (Monolithic; post-HT) | | | |
|---|---|---|---|
| Characteristic | General | More Preferred | Most Preferred |
| $R_s$ (ohms/sq.): | <=3.0 | <=2.5 | <=2.1 |
| $E_n$: | <=0.07 | <=0.04 | <=0.03 |
| $T_{vis}$ (Ill. C. 2°): | >=78% | >=79% | >=80% |
| Haze: | <=0.40 | <=0.35 | <=0.30 |

Moreover, in certain example laminated embodiments of this invention, coated articles herein which have been heat treated to an extent sufficient for tempering and/or heat bending, and which have been laminated to another glass substrate, may have the following optical/solar characteristics:

| Optical/Solar Characteristics (Laminated; post-HT) | | | |
|---|---|---|---|
| Characteristic | General | More Preferred | Most Preferred |
| $R_s$ (ohms/sq.): | <=3.0 | <=2.5 | <=2.1 |
| $E_n$: | <=0.07 | <=0.04 | <=0.03 |
| $T_{vis}$ (Ill. D65 10°): | >=75% | >=76% | >=77% (or ≧77.5%) |
| Haze: | <=0.45 | <=0.40 | <=0.36 |

Moreover, coated articles including coatings according to certain example embodiments of this invention have the following optical characteristics (e.g., when the coating(s) is provided on a clear soda lime silica glass substrate 1 from 1 to 10 mm thick; e.g., 2.1 mm may be used for a glass substrate reference thickness in certain example non-limiting instances) (laminated). While multiple measurements may be taken at different locations across the laminate, this data is based on the average of such points.

| Example Optical Characteristics (Laminated: post-HT) | | |
|---|---|---|
| Characteristic | General | More Preferred |
| $T_{vis}$ (or TY)(Ill. D65 10°): | >=75% | >=77% |
| $a*_t$ (Ill. D65 10°): | −6 to +1.0 | −4 to 0.0 |
| $b*_t$ (Ill. D65 10°): | −2.0 to +8.0 | 0.0 to 4.0 |
| L* (Ill. D65 10°): | 88-95 | 90-95 |
| $R_fY$ (Ill. C., 2 deg.): | 1 to 12% | 1 to 10% |
| $a*_f$ (Ill. C., 2°): | −5.0 to +2.0 | −3.5 to +0.5 |
| $b*_f$ (Ill. C., 2°): | −14.0 to +10.0 | −10.0 to 0 |
| L* (Ill. C. 2°): | 30-40 | 33-38 |
| $R_gY$ (Ill. C., 2 deg.): | 1 to 12% | 1 to 10% |
| $a*_g$ (Ill. C., 2°): | −5.0 to +2.0 | −2 to +2.0 |
| $b*_g$ (Ill. C., 2°): | −14.0 to +10.0 | −11.0 to 0 |
| L* (Ill. C. 2°): | 30-40 | 33-38 |

The following examples are provided for purposes of example only, and are not intended to be limiting unless specifically claimed.

EXAMPLE

The following Examples were made via sputtering on 2.1 mm thick clear glass substrates so as to have approximately the layer stack set forth below and shown in FIG. 1. The thicknesses are approximations, and are in units of angstroms (Å).

| Layer Stack for Examples 1-2 | | |
|---|---|---|
| Layer | Example 1 | Example 2 |
| Glass Substrate | | |
| $Si_xN_y$ | 177 | 190 |
| $ZnAlO_x$ | 109 | 109 |
| Ag | 96 | 95 |
| $NiCrO_x$ | 25 | 25 |
| $SnO_2$ | 535 | 530 |
| $Si_xN_y$ | 126 | 126 |
| $ZnAlO_x$ | 115 | 115 |
| Ag | 95 | 91 |
| $NiCrO_x$ | 25 | 25 |
| $SnO_2$ | 127 | 262 |
| $Si_3N_4$ | 237 | 109 |

It can be seen from the above that Examples 1 and 2 differed from one another primary with respect to the upper dielectric layers. In particular, about 40-60% (more precisely about 50%) of the top silicon nitride layer was replaced by tin oxide in Example 2 compared to Example 1. In other words, Example 2 used a thicker tin oxide layer 23 and thinner silicon nitride layer 25, compared to Example 1. Surprisingly, this permitted Example 2 to perform better with regard to mottling.

The processes used in forming the coated article of the Examples are set forth below. The gas flows (argon (Ar), oxygen (O), and nitrogen (N)) in the below table are in units of sccm, and include both tuning gas and gas introduced through the main. The line speed was about 5 m/min. The pressures are in units of mbar×$10^{-3}$. The silicon (Si) targets, and thus the silicon nitride layers, were doped with about 10% aluminum (Al). The Zn targets in a similar manner were doped with about 2% Al.

| Cathode | Target | Power(kW) | Ar | O | N | Volts | Pressure |
|---|---|---|---|---|---|---|---|
| Sputtering Process Used in Example 1 | | | | | | | |
| C11 | Si | 51.3 | 350 | 0 | 337 | 269 | 2.39 |
| C12 | Si | 51.6 | 350 | 0 | 337 | 271 | 2.36 |
| C14 | Zn | 19.5 | 250 | 350 | 0 | 276 | 2.24 |
| C15 | Zn | 27.8 | 250 | 350 | 0 | 220 | 1.88 |
| C24 | Ag | 9.2 | 250 | 0 | 0 | 541 | 1.69 |
| C25 | NiCr | 16.5 | 350 | 190 | 0 | 510 | 2.33 |
| C28 | Sn | 27.3 | 250 | 454 | 350 | 258 | 2.30 |
| C29 | Sn | 27.3 | 250 | 504 | 350 | 246 | 1.97 |
| C39 | Sn | 30 | 250 | 548 | 350 | 257 | 2.29 |
| C40 | Sn | 28.5 | 250 | 458 | 350 | 245 | 2.20 |
| C41 | Sn | 30.8 | 250 | 518 | 350 | 267 | 2.45 |
| C43 | Si | 59.7 | 350 | 0 | 376 | 285 | 2.47 |
| C45 | Zn | 26.9 | 250 | 345 | 0 | 209 | 3.78 |
| C46 | Zn | 26.8 | 250 | 345 | 0 | 206 | 1.81 |
| C49 | Ag | 9.8 | 150 | 0 | 0 | 465 | 1.81 |
| C50 | NiCr | 16.6 | 250 | 155 | 0 | 575 | 1.81 |
| C54 | Sn | 47.3 | 250 | 673 | 350 | 314 | 1.92 |
| C59 | Si | 65 | 350 | 0 | 463 | 288 | 2.63 |
| C60 | Si | 65 | 350 | 0 | 463 | 330 | 2.56 |
| Sputtering Process Used in Example 2 | | | | | | | |
| C11 | Si | 51.3 | 350 | 0 | 337 | 269 | 2.39 |
| C12 | Si | 51.6 | 350 | 0 | 337 | 271 | 2.36 |
| C14 | Zn | 19.5 | 250 | 350 | 0 | 276 | 2.24 |
| C15 | Zn | 27.8 | 250 | 350 | 0 | 220 | 1.88 |
| C24 | Ag | 9.2 | 250 | 0 | 0 | 549 | 1.84 |
| C25 | NiCr | 16.5 | 350 | 190 | 0 | 514 | 2.33 |
| C28 | Sn | 27.5 | 250 | 454 | 350 | 256 | 2.30 |
| C29 | Sn | 27.4 | 250 | 504 | 350 | 247 | 1.97 |
| C39 | Sn | 31.4 | 250 | 548 | 350 | 251 | 2.35 |
| C40 | Sn | 29.2 | 250 | 458 | 350 | 245 | 2.24 |
| C41 | Sn | 32 | 250 | 518 | 350 | 268 | 2.45 |
| C43 | Si | 59.7 | 350 | 0 | 376 | 285 | 2.47 |
| C45 | Zn | 25.8 | 250 | 345 | 0 | 208 | 3.68 |
| C46 | Zn | 25.5 | 250 | 345 | 0 | 206 | 1.76 |
| C49 | Ag | 9.8 | 150 | 0 | 0 | 487 | 1.81 |
| C50 | NiCr | 16.6 | 250 | 155 | 0 | 575 | 1.81 |
| C54 | Sn | 34 | 250 | 528 | 350 | 271 | 2.04 |
| C55 | Sn | 35 | 250 | 573 | 350 | 276 | 2.70 |
| C59 | Si | 65 | 350 | 0 | 473 | 291 | 2.63 |

After being sputter deposited onto the glass substrates, the Example coated articles were heat treated in a manner sufficient for tempering and heat bending, and following this heat treatment had the following characteristics as measured in monolithic form. This post-HT data is based on the average data of data taken from multiple points on the coated article.

| Characteristics of Examples 1-2 (Monolithic; post - HT) | | |
|---|---|---|
| Characteristic | Example 1 | Example 2 |
| Visible Trans. ($T_{vis}$ or TY)(Ill. C. 2 deg.): | 80.0% | 79.5% |
| a* | −4.8 | −1.5 |
| b* | 10.7 | −0.7 |
| Glass Side Reflectance (RY)(Ill C., 2 deg.): | 8.3% | 8.4% |
| a* | −3.5 | 0.6 |
| b* | 7.8 | 10.3 |
| Film Side Reflective (FY)(Ill. C., 2 deg.): | 7.5% | 7.7% |
| a* | −5.8 | −8.4 |
| b* | 14.2 | 15.9 |
| $R_s$ (ohms/square) (pre-HT): | 2.74 | 2.75 |
| $R_s$ (ohms/square) (post-HT): | 2.07 | 2.07 |
| Haze: | 0.28 | 0.27 |

The coated articles of Example 1-2 were then laminated to other corresponding heat treated and bent glass substrates, respectively, to form laminated vehicle windshield products.

Following the lamination, the resulting coated article laminates (or windshields) had the following characteristics.

| Characteristics of Examples 1-2 (Laminated; post - HT) | | |
|---|---|---|
| Characteristic | Example 1 | Example 2 |
| Visible Trans. ($T_{vis}$ or TY)(Ill. D65 10°): | 77.8% | 77.4% |
| a* | −3.1 | −3.1 |
| b* | 3.5 | 3.5 |
| Glass Side Reflectance (RY)(Ill C., 2 deg.): | 9.0% | 9.1% |
| a* | 1.5 | 1.4 |
| b* | −9.1 | −8.9 |
| Film Side Reflective (FY)(Ill. C., 2 deg.): | 8.9% | 9.0% |
| a* | −1.1 | −1.6 |
| b* | −7.8 | −7.5 |
| $R_s$ (ohms/square): | see above | see above |
| Haze: | 0.32 | 0.36 |

It can be seen by comparing Examples 1-2 above to Examples 1-3 in U.S. Pat. No. 6,686,050, that the Examples 1-2 above achieved significantly higher visible transmission and significantly lower sheet resistance than did the articles of the Examples in the '050 patent. Thus, the unexpected results associated with the instant invention are evidenced. For example, it can be seen that the layer thicknesses and stoichiometries for Examples 1-2 above, compared to the '050 patent coated articles, unexpectedly resulted in improved sheet resistance and improved visible transmission. For example, Examples 1 and 2 above realized laminated HT visible transmissions of 77.8% and 77.4%, respectively, compared to much lower laminated HT visible transmissions of 74.68% to 75.37% in Examples 1-3 of the '050 patent. As another example, Examples 1 and 2 above each realized monolithic HT sheet resistance values of 2.07 ohms/square, compared to much higher monolithic HT sheet resistance values of 3.33 to 3.46 ohms/square in Examples 1-3 of the '050 patent. These represent significant improvements in the art both optically and with respect to solar performance.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A heat treated coated article comprising a coating supported by a glass substrate, the coating comprising:
   a first layer comprising silicon nitride which is located on and directly contacts a surface of the glass substrate;
   a first layer comprising zinc oxide located over at least the first layer comprising silicon nitride;
   a first infrared (IR) reflecting layer comprising silver located over and contacting the first layer comprising zinc oxide;
   a second layer comprising silicon nitride located over at least the first IR reflecting layer;
   a second layer comprising zinc oxide located over at least the second layer comprising silicon nitride;
   a second IR reflecting layer comprising silver located over and contacting the second layer comprising zinc oxide;
   a layer comprising an oxide of Ni and/or Cr located over and contacting the second IR reflecting layer;
   a layer comprising tin oxide located over at least the layer comprising an oxide of Ni and/or Cr;
   a layer comprising silicon nitride located over and contacting the layer comprising tin oxide, wherein the layer comprising tin oxide is significantly thicker than the layer comprising silicon nitride; and
   wherein the coated article following heat treatment, measured monolithically, has a sheet resistance of less or equal to 2.5 ohms/square, a haze value of less than or equal to 0.35, and a visible transmission of at least 80%.

2. The coated article of claim 1, wherein the coated article following heat treatment, measured monolithically, has a haze value of less than or equal to 0.30.

3. The coated article of claim 1, wherein at least one of the first and second layers comprising silicon nitride is Si-rich so as to be represented by $Si_xN_y$, where x/y is from 0.8 to 1.4.

4. The coated article of claim 1, wherein said another dielectric layer, located over at least the layer comprising an oxide of Ni and/or Cr, comprises a first layer comprising tin oxide and another layer comprising silicon nitride which is an outermost layer of the coating.

5. The coated article of claim 1, further comprising a layer comprising tin oxide located between the first IR reflecting layer and the second layer comprising silicon nitride.

6. The coated article of claim 1, further comprising a layer comprising an oxide of Ni and/or Cr located directly on and contacting the first IR reflecting layer.

7. The coated article of claim 1, wherein at least one of the first and second layers comprising silicon nitride includes from 1-10% aluminum.

8. The coated article of claim 1, wherein at least one of the first and second layers comprising zinc oxide includes from 1-10% aluminum.

9. The coated article of claim 1, wherein said layer comprising an oxide of Ni and/or Cr includes an oxide of NiCr and is from 30-45 Å thick.

10. The coated article of claim 1, wherein said second layer comprising silicon nitride is from 90-150 Å thick.

11. A laminated vehicle windshield including the coated article of claim 1 laminated to another glass substrate wherein the laminated vehicle windshield has a visible transmission of at least 76.0%.

12. The laminated vehicle windshield of claim 11, wherein the laminated vehicle windshield has a visible transmission of at least 77.0%.

13. The coated article of claim 1, wherein the layer comprising tin oxide is at least twice as thick as the layer comprising silicon nitride.

14. A heat treated coated article comprising a coating supported by a glass substrate, the coating comprising:
   a first dielectric layer on the substrate;
   a first infrared (IR) reflecting layer located over at least the first dielectric layer;
   a second dielectric layer located over at least the first IR reflecting layer;
   a second IR reflecting layer located over at least the second dielectric layer;
   a layer comprising tin oxide located over at least the second IR reflecting layer;
   a layer comprising silicon nitride located over and contacting the layer comprising tin oxide, wherein the layer comprising tin oxide is significantly thicker than the layer comprising silicon nitride; and
   wherein the coated article following heat treatment, measured monolithically, has a sheet resistance of less than 2.5 ohms/square, a haze value of less than or equal to 0.35, and a visible transmission of at least 80%.

15. The coated article of claim 14, wherein the coated article following heat treatment, measured monolithically, has a haze value of less than or equal to 0.30.

16. The coated article of claim 14, wherein at least one of the dielectric layers comprises silicon nitride which is Si-rich so as to be represented by $Si_xN_y$, where x/y is from 0.8 to 1.4.

17. The coated article of claim 14, wherein said first and second IR reflecting layers are located on and contacting first and second layers comprising zinc oxide, respectively.

18. The coated article of claim 14, wherein the layer comprising tin oxide is at least twice as thick as the layer comprising silicon nitride.

19. A heat treated coated article comprising a coating supported by a glass substrate, the coating comprising:
  a first layer comprising silicon nitride which is located on and directly contacts a surface of the glass substrate;
  a first layer comprising zinc oxide located over at least the first layer comprising silicon nitride;
  a first infrared (IR) reflecting layer comprising silver located over and contacting the first layer comprising zinc oxide;
  a second layer comprising silicon nitride located over at least the first IR reflecting layer;
  a second layer comprising zinc oxide located over at least the second layer comprising silicon nitride;
  a second IR reflecting layer comprising silver located over and contacting the second layer comprising zinc oxide;
  a layer comprising an oxide of Ni and/or Cr located over and contacting the second IR reflecting layer;
  at least another dielectric layer located over at least the layer comprising an oxide of Ni and/or Cr; and
  wherein the coated article following heat treatment, measured monolithically, has a sheet resistance of less than or equal to 3.0 ohms/square, and a visible transmission of at least 78%.

20. The coated article of claim 19, wherein the coated article following heat treatment, measured monolithically, has a sheet resistance of no greater than 2.5 ohms/square.

21. The coated article of claim 19, wherein the coated article following heat treatment, measured monolithically, has a haze value of less than or equal to 0.35.

22. The coated article of claim 19, wherein the coated article following heat treatment, measured monolithically, has a visible transmission of at least about 80%.

23. The coated article of claim 19, wherein said another dielectric layer comprises tin oxide.

24. The coated article of claim 19, wherein said another dielectric layer comprises tin oxide, and wherein the coated article further comprises a layer comprising silicon nitride located over and contacting said another dielectric layer which comprises tin oxide, wherein said another dielectric layer which comprises tin oxide is significantly thicker than the layer comprising silicon nitride.

25. The coated article of claim 19, further comprising both a layer comprising an oxide of NiCr and a layer comprising tin oxide located between the first infrared (IR) reflecting layer comprising silver and the first layer comprising zinc oxide, wherein the layer comprising an oxide of NiCr directly contacts the first IR reflecting layer comprising silver and the layer comprising tin oxide.

* * * * *